(12) United States Patent
Chen et al.

(10) Patent No.: US 6,194,298 B1
(45) Date of Patent: Feb. 27, 2001

(54) METHOD OF FABRICATING SEMICONDUCTOR DEVICE

(75) Inventors: Ming-Shing Chen, Feng-Shan; Akira Mao, Tainan, both of (TW)

(73) Assignee: United Semiconductor Corp., Hsinchu (TW)

( * ) Notice: Subject to any disclaimer, the term of this patent is extended or adjusted under 35 U.S.C. 154(b) by 0 days.

(21) Appl. No.: 09/315,797

(22) Filed: May 21, 1999

(30) Foreign Application Priority Data

Apr. 19, 1999 (TW) .................................................. 88106211

(51) Int. Cl.$^7$ .................... H01L 21/3205; H01L 21/4763
(52) U.S. Cl. .......................... 438/592; 438/682; 257/382
(58) Field of Search ..................................... 438/592, 199, 438/259, 682, 229, 595, 664; 257/382, 383, 384, 413, 763, 914

(56) References Cited

U.S. PATENT DOCUMENTS

| | | | |
|---|---|---|---|
| 5,635,746 | * 6/1997 | Kirmura et al. | ...................... 438/382 |
| 5,902,121 | * 5/1999 | Goto | ...................................... 438/199 |
| 5,956,617 | * 9/1999 | Kirmura et al. | ...................... 438/682 |
| 6,066,532 | * 5/2000 | Chen et al. | ........................... 438/259 |

* cited by examiner

*Primary Examiner*—David Nelms
*Assistant Examiner*—Phuc T. Dang
(74) *Attorney, Agent, or Firm*—Jiawei Huang; J C Patents

(57) ABSTRACT

A method of fabricating a semiconductor device is described. A conductive layer is formed on a substrate. A spacer is formed on a sidewall of the conductive layer. A thin metallic layer is formed over the substrate. An ion implantation step is performed. A first seeding layer is formed between the first metallic layer and the conductive layer. A second seeding layer is formed between the first metallic layer and the substrate. A second metallic layer is formed over the substrate. An annealing step is performed to form a self-aligned silicide layer on the conductive layer. The first metallic layer and the second metallic layer that do not react are removed.

22 Claims, 3 Drawing Sheets

METHOD OF FABRICATING SEMICONDUCTOR DEVICE

CROSS-REFERENCE TO RELATED APPLICATION

This application claims the priority benefit of Taiwan application serial no. 88106211, filed Apr. 19, 1999, the full disclosure of which is incorporated herein by reference.

BACKGROUND OF THE INVENTION

1. Field of the Invention

The present invention relates to a semiconductor fabricating method. More particularly, the present invention relates to a method of fabricating a self-aligned silicide layer.

2. Description of the Related Art

In a deep sub-micron semiconductor fabrication process, linewidth, contact area, and junction depth are greatly reduced. In order to effectively enhance the performance of devices, reduce device resistance, and reduce device resistancecapacitance (RC) delay, silicide layers has been used to form on a gate or a source/drain region in the fabrication process.

A process that is commonly used nowadays for forming a silicide layer in integration circuits is the self-aligned silicide (salicide) process. FIGS. 1A through 1C are schematic, cross-sectional views of a conventional self-aligned silicide process.

In FIG. 1A, an isolation structure 101 is formed in a substrate 100. A gate 105 comprising a gate conductive layer 102 and a gate oxide layer 103 is formed on the substrate 100. A spacer 104 is formed on the sidewall of the gate 105. A source/drain region 112 is formed on opposite sides of the gate 105 in the substrate 100. A pre-amorphous implantation (PAI) step is performed on the substrate 100. The surfaces of the gate 105 and the source/drain region 112 are thus amorphized. In FIG. 2B, a metallic layer 122 is formed over the substrate 100. Referring to FIG. 1C, an annealing step is performed. The metallic layer 122 on the gate 105 and the source/drain region 112 is converted into silicide layers 124 and 126. The metallic layer 122, which does not react, is removed by selective wet etching. The silicide layer 124 is formed on the gate 105 and the silicide layer 126 is formed on the source/drain region 112. Since there is no patterning step, such as a photolithography step, required for forming the silicide layers 124 and 126, the above-described process is called a self-aligned silicide process.

The conventional method amorphizes the substrate 100 and the gate 105 by ion implantation (shown in FIG. 1), which implants ions directly into the substrate 100. Because there is no buffer layer covering on the substrate 100, the ions easily penetrate into deep-inner portion of the substrate 100 and cause a channel effect to occur. This further affects properties of devices.

SUMMARY OF THE INVENTION

The invention provides a method of fabricating a semiconductor device. A conductive layer is formed on a substrate. A spacer is formed on a sidewall of the conductive layer. A thin metallic layer is formed over the substrate. An ion implantation step is performed. A first seeding layer is formed between the first metallic layer and the conductive layer. A second seeding layer is formed between the first metallic layer and the substrate. A second metallic layer is formed over the substrate. An annealing step is performed to form a self-aligned silicide layer on the conductive layer. The first metallic layer and the second metallic layer that do not react are removed.

The present invention first forms the thin metallic layer over the substrate and then performs the ion implantation step with the thin metallic layer serving as a mask. Thus, the present invention prevents occurrence of the channel effect and maintains electrical properties of devices. The reliability of the devices is further increased. In addition, the invention forms the first and the second seeding layers on the gate conductive layer and the source/drain region, so that the formation of self-aligned silicide layers is hastened.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DESCRIPTION OF THE PREFERRED EMBODIMENTS

Figure 1A:
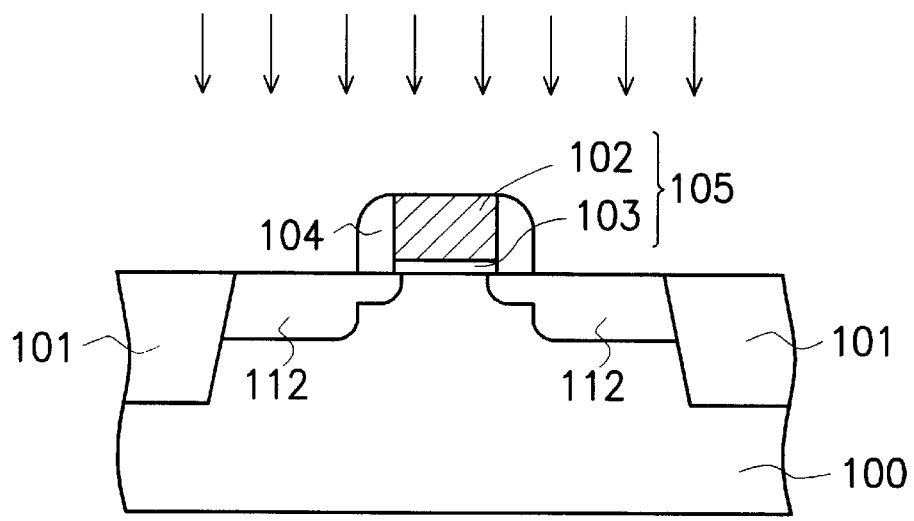
FIGS. 1A through 1C are schematic, cross-sectional views of a conventional method of fabricating a silicide layer.
Figure 1B:
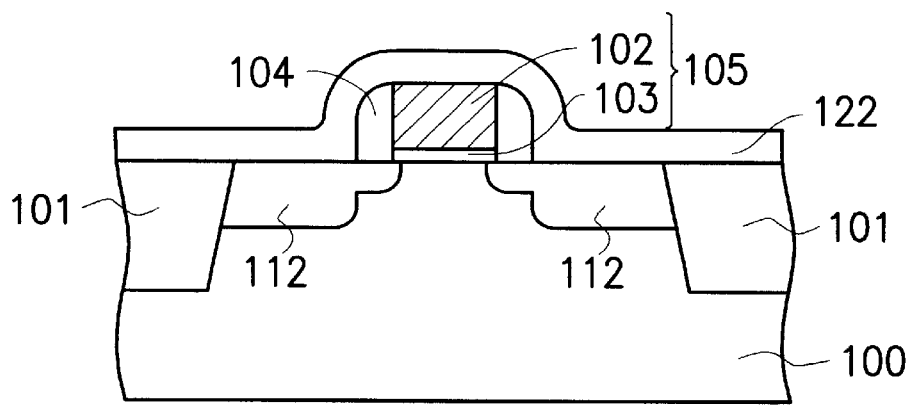
Figure 1C:
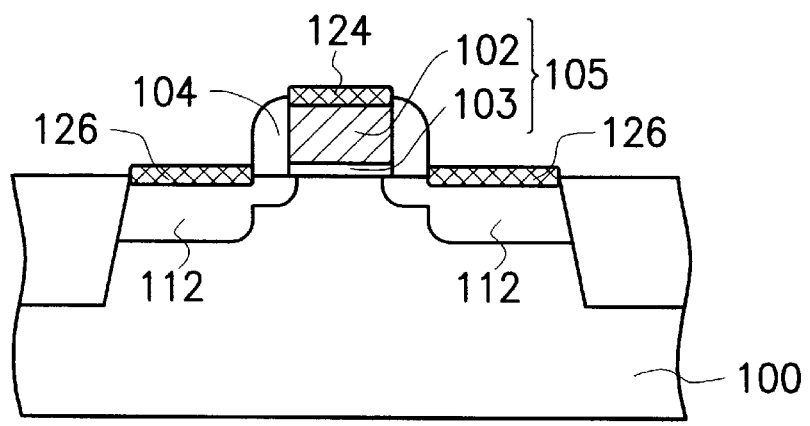

Reference will now be made in detail to the present preferred embodiments of the invention, examples of which are illustrated in the accompanying drawings. Wherever possible, the same reference numbers are used in the drawings and the description to refer to the same or like parts.

FIGS. 2A through 2E are schematic, cross-sectional views showing a method of fabricating a semiconductor device according to one preferred embodiment of the invention.

Figure 2A:
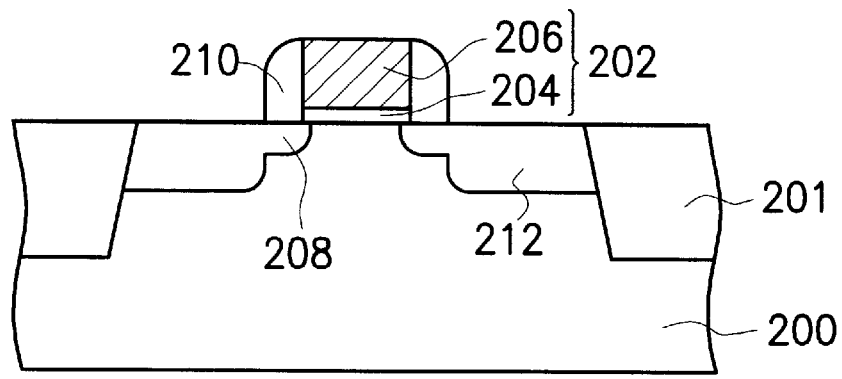
FIGS. 2A through 2E are schematic, cross-sectional views showing a method of fabricating a semiconductor device according to one preferred embodiment of the invention.

In FIG. 2A, an isolation structure 201, such as a shallow trench isolation (STI) structure, is formed in a substrate 200. The substrate 200 comprises a P-type silicon substrate. A gate 202 is formed on the substrate 200. The gate 202 comprises a gate oxide layer 204 and a gate conductive layer 206. The gate oxide layer 204 can be formed by, for example, thermal oxidation or chemical vapor deposition. The thickness of the gate oxide layer 204 is preferably about 30 angstroms to 50 angstroms, but is not limited to this certain thickness. The gate conductive layer 206 can be formed by, for example, chemical vapor deposition. The thickness of the gate conductive layer 206 is preferably about 2500 angstroms.

Still referring to FIG. 2A, an ion implantation step is performed on the substrate 200 with the gate 202 and the isolation structure 201 serving as masks. A lightly doped source/drain region 208 is formed on opposite sides of the gate 202 in the substrate 200. The impurities implanted in the ion implantation step comprise N-type ions, such as phosphorus (P) ions. A spacer 210 is formed on the sidewall of the gate 202. The material of the spacer 210 comprises silicon nitride and silicon-oxy-nitride. An ion implantation step is performed with the gate 206, the spacer 210, and the isolation structure 201 serving as masks. A heavily doped source/drain region 212 is formed on opposite sides of the spacer 210 in the substrate 200. The impurities implanted in the ion implantation step comprise N-type ions, such as arsenic (As) ions or phosphorus (P) ions.

Figure 2B:
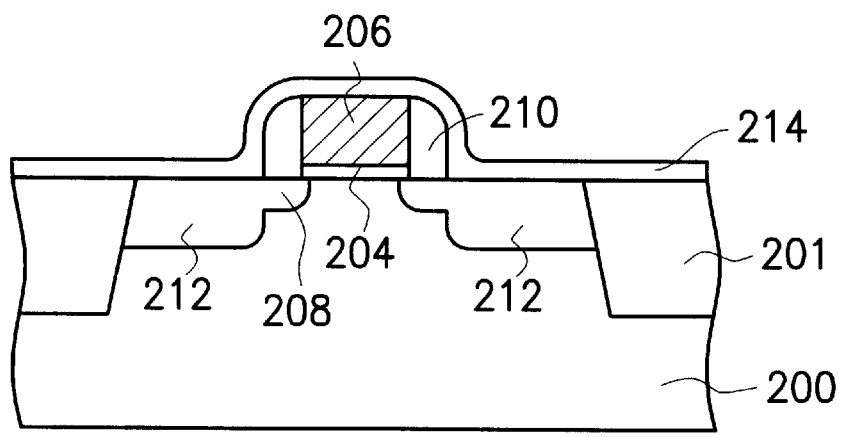

In FIG. 2B, a thin metallic layer 214 serving as a buffer layer is formed over the substrate 200. The material of the thin metallic layer 214 comprises thermally hardened metal, such as titanium, tungsten, cobalt, nickel, platinum, or palladium. The thin metallic layer 214 can be formed by, for example, chemical vapor deposition or physical vapor deposition. The thickness of the thin metallic layer 214 is preferably about 20 angstroms to 70 angstroms.

Figure 2C:
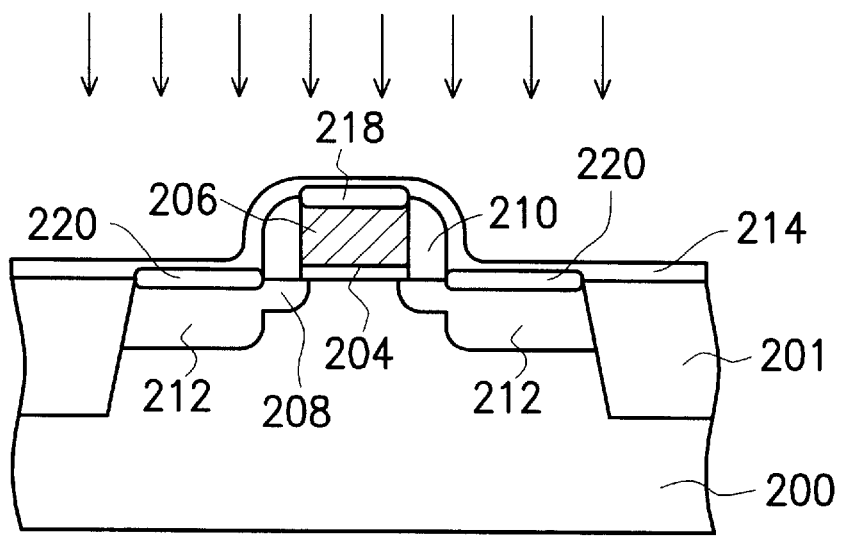

In FIG. 2C, a pre-amorphous implantation step is performed. The thin metallic layer 214 is amorphized. In the pre-amorphous implantation step, ions are implanted into the junction between the thin metallic layer 214 and the substrate 200 and the junction between the thin metallic layer 214 and the gate conductive layer 206 through the thin metallic layer 214. Thus, the crystal lattices of the thin metallic layer 214, the substrate 200, and the gate conductive layer 206 are destroyed by implanted ions to form a physical lattice mixture. A seeding layer 218 is formed on the gate conductive layer 206. A seeding layer 220 is formed on the substrate 200. The seeding layers 218 and 220 benefit the formation of silicide layers in the subsequent step (shown in FIG. 2E). In the pre-amorphous implantation, implanted ions comprise arsenic ions and silicon ions and the implanting energy is about 80 KeV to 120 KeV.

In the present invention, the pre-amorphous implantation step is performed on the substrate 200 with the thin metallic layer 214 covering. That is, in the invention, the thin metallic layer 214 serves as a buffer layer. Thus, the thin metallic layer 214 prevents ions from striking directly on the substrate 200 and penetrating into deep portions of the substrate 200 to cause the channel effect.

Figure 2D:
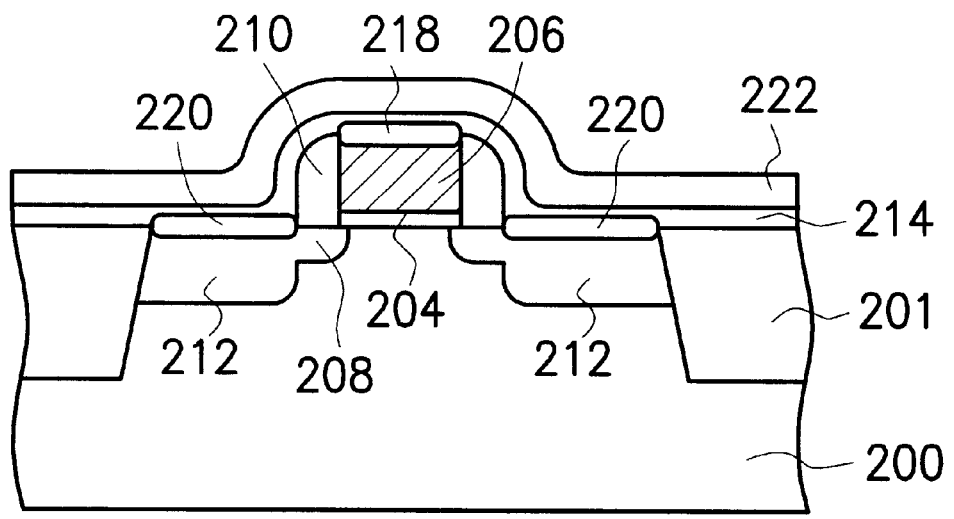

In FIG. 2D, a metallic layer 222 is formed over the substrate 200. The material of the metallic layer 222 comprises thermally hardened material metal, such as titanium, tungsten, cobalt, nickel, platinum, and palladium. The metallic layer 222 can be, for example, chemical vapor deposition or physical vapor deposition. The thickness of the metallic layer 222 is preferably about 150 angstroms to 200 angstroms.

Figure 2E:
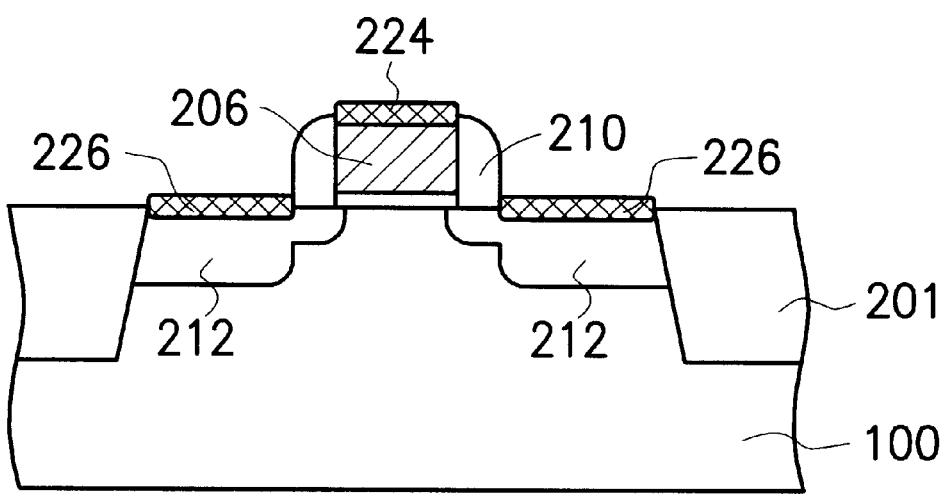

In FIG. 2E, an annealing step is performed. The thin metallic layer 214 and the metallic layer 222 above the gate conductive layer 206 are converted into the metallic silicide layer 224. The thin metallic layer 214 and the metallic layer 222 above the source/drain region 212 are converted into the metallic layer 226. The thin metallic layer 214 and the metallic layer 222 that do not react are removed by, for example, selective wet etching. In a case where the material of the thin metallic layer 214 and the metallic layer 222 is titanium, an rapid thermal process is carried out in the annealing step at a temperature of about 800 degrees Celsius. The selective wet etching step is preferably performed with an etchant solution comprising $H_2O_2$ and $NH_4OH$.

In the present invention, the seeding layers 218 and 220 are formed on the substrate 200 and the gate conductive layer 206. The seeding layers 218 and 220 hasten the reaction between the metallic layer 214 and 222, and the gate conductive layer 206, or the source/drain region 212. The formation of the self-aligned metallic silicide layers 224 and 226 is thus faster.

In summary, the invention includes at least the following advantages:

1. The present invention first forms a thin metallic layer over a substrate and then performs a pre-amorphous implantation step with the thin metallic layer serving as a mask. Thus, the present invention prevents occurrence of the channel effect and maintains electrical properties of devices. The reliability of the devices is further increased.

2. The invention forms seeding layers on a gate conductive layer and a source/drain region to hasten the formation of self-aligned silicide layers.

It will be apparent to those skilled in the art that various modifications and variations can be made to the structure and the method of the present invention without departing from the scope or spirit of the invention. In view of the foregoing, it is intended that the present invention cover modifications and variations of this invention provided they fall within the scope of the following claims and their equivalents.

What is claimed is:

1. A method of fabricating a semiconductor device, comprising the steps of:
    forming a conductive layer on a substrate;
    forming a spacer on a sidewall of the conductive layer;
    forming a first metallic layer over the substrate;
    performing an ion implantation step on the substrate and the conductive layer through the first metallic layer by using the first metal layer as a buffer layer, wherein a first seeding layer is formed between the first metallic layer and the conductive layer and a second seeding layer is formed between the first metallic layer and the substrate;
    forming a second metallic layer over the substrate;
    performing an annealing step to form a self-aligned silicide layer on the conductive layer; and
    removing the first metallic layer and the second metallic layer that do not react.

2. The method of claim 1, wherein the thickness of the first metallic layer is about 20 angstroms to 70 angstroms.

3. The method of claim 2, wherein the ion implantation step is performed with an energy of about 80 KeV to 120 KeV.

4. The method of claim 2, wherein ions implanted in the ion implantation step comprise silicon ions.

5. The method of claim 2, wherein ions implanted in the ion implantation step comprise arsenic ions.

6. The method of claim 1, wherein ions implanted in the ion implantation step comprise silicon ions.

7. The method of claim 1, wherein ions implanted in the ion implantation step comprise arsenic ions.

8. The method of claim 1, wherein the first metallic layer and the second metallic layer comprise thermally hardened metal.

9. The method of claim 1, wherein the annealing step comprises a rapid thermal process.

10. A method of fabricating a semiconductor device, comprising the steps of:
    forming a gate on a substrate, wherein the gate comprises a gate oxide layer and a gate conductive layer;
    forming a spacer on a sidewall of the gate;
    forming a source/drain region on opposite sides of the gate in the substrate;
    forming a first metallic layer over the substrate;
    performing an ion implantation step on the source/drain region and the gate conductive layer through the first metallic layer by using the first metal layer as a buffer layer, wherein a first seeding layer is formed between the first metallic layer and the gate conductive layer and a second seeding layer is formed between the first metallic layer and the substrate;

forming a second metallic layer over the substrate;

performing an annealing step to form self-aligned silicide layers on the gate conductive layer and the source/drain region; and removing the first metallic layer and the second metallic layer that do not react.

11. The method of claim 10, wherein the thickness of the first metal layer is about 20 angstroms to 70 angstroms.

12. The method of claim 11, wherein the ion implantation is performed with an energy of about 80 KeV about 120 KeV.

13. The method of claim 11, wherein ions implanted in the ion implantation step comprise silicon ions.

14. The method of claim 11, wherein ions implanted in the ion implantation step comprise arsenic ions.

15. The method of claim 10, wherein ions implanted in the ion implantation step comprise silicon ions.

16. The method of claim 10, wherein ions implanted in the ion implantation step comprise arsenic ions.

17. The method of claim 10, wherein the first metallic layer and the second metallic layer comprise thermally hardened metal.

18. The method of claim 10, wherein the annealing step comprises a rapid thermal process.

19. A method of fabricating a semiconductor device, comprising the steps of:

forming a conductive layer on a substrate;

forming a spacer on a sidewall of the conductive layer;

forming a first metallic layer over the substrate;

performing a pre-amorphous implantation step on the substrate and the conductive layer through the first metallic layer by using the first metal layer as a buffer layer, wherein a first seeding layer is formed between the first metallic layer and the conductive layer and a second seeding layer is formed between the first metallic layer and the substrate, wherein a first crystal lattice between the first metallic layer and the conductive layer and a second crystal lattice between the substrate and the first metallic layer are destroyed to form a physical lattice mixture;

forming a second metallic layer over the substrate;

performing an annealing step to form a self-aligned silicide layer on the conductive layer; and removing the remaining first metallic layer and the second metallic layer.

20. A method of claim 19, wherein during performing the step of performing an annealing step to form a self-aligned silicide layer, the first seeding layer and the second seeding layer respectively hasten the reaction between the first and second metallic layers and the conductive layer and the substrate and the first and second metallic layers.

21. A method of fabricating a semiconductor device, comprising the steps of:

forming a gate on a substrate, wherein the gate comprises a gate oxide layer and a gate conductive layer;

forming a spacer on a sidewall of the gate;

forming a source/drain region on opposite sides of the gate in the substrate;

forming a first metallic layer over the substrate;

performing a pre-amorphous implantation step on the source/drain region and the conductive layer through the first metallic layer by using the first metal layer as a buffer layer, wherein a first seeding layer is formed between the first metallic layer and the gate conductive layer and a second seeding layer is formed between the first metallic layer and the source/drain region, wherein a first crystal lattice between the first metallic layer and the conductive layer and a second crystal lattice between the source/drain region and the first metallic layer are destroyed to form a physical lattice mixture;

forming a second metallic layer over the substrate;

performing an annealing step to form self-aligned silicide layers on the gate conductive layer and the source/drain region; and removing the first metallic layer and the second metallic layer that do not react.

22. A method of claim 21, wherein during performing the step of performing an annealing step to form a self-aligned silicide layer, the first seeding layer and the second seeding layer respectively hasten the reaction between the first and second metallic layers and the conductive layer and the source/drain region and the first and second metallic layers.

* * * * *